(12) United States Patent
Lagowski et al.

(10) Patent No.: US 6,538,462 B1
(45) Date of Patent: Mar. 25, 2003

(54) METHOD FOR MEASURING STRESS INDUCED LEAKAGE CURRENT AND GATE DIELECTRIC INTEGRITY USING CORONA DISCHARGE

(75) Inventors: Jacek Lagowski, Tampa, FL (US); Marshall Wilson, Lutz, FL (US); Alexander Savtchouk, Tampa, FL (US)

(73) Assignee: Semiconductor Diagnostics, Inc., Tampa, FL (US)

(*) Notice: Subject to any disclaimer, the term of this patent is extended or adjusted under 35 U.S.C. 154(b) by 0 days.

(21) Appl. No.: 09/451,652

(22) Filed: Nov. 30, 1999

(51) Int. Cl.[7] .................. G01R 31/26; G01R 31/02; G01R 1/04
(52) U.S. Cl. .................. 324/765; 324/760; 324/158.1
(58) Field of Search .................. 324/760, 765, 324/158.1, 750, 455; 438/14, 17, 18

(56) References Cited

U.S. PATENT DOCUMENTS

| | | | | |
|---|---|---|---|---|
| 4,015,203 A | | 3/1977 | Verkuil .................. 324/158 D |
| 4,326,165 A | | 4/1982 | Szedon .................. 324/158 R |
| 4,780,680 A | | 10/1988 | Reuter et al. .................. 324/455 |
| 4,812,756 A | * | 3/1989 | Curtis et al. .................. 324/750 |
| 4,978,915 A | * | 12/1990 | Andrews, Jr. et al. .................. 324/765 |
| 5,216,362 A | | 6/1993 | Verkuil .................. 324/158 D |
| 5,485,091 A | | 1/1996 | Verkuil .................. 324/455 |
| 5,498,974 A | * | 3/1996 | Verkuil et al. .................. 324/767 |
| 5,519,334 A | * | 5/1996 | Dawson .................. 324/765 |
| 5,594,247 A | | 1/1997 | Verkuil et al. .................. 250/326 |
| 5,644,223 A | | 7/1997 | Verkuil .................. 324/158.1 |
| 5,773,989 A | | 6/1998 | Edelman et al. .................. 324/765 |
| 6,011,404 A | * | 1/2000 | Ma et al. .................. 324/765 |
| 6,037,797 A | * | 3/2000 | Lagowski et al. .................. 324/765 |
| 6,043,102 A | * | 3/2000 | Fang et al. .................. 438/14 |
| 6,114,865 A | * | 9/2000 | Lagowski et al. .................. 324/765 |
| 6,202,029 B1 | * | 3/2001 | Verkuil et al. .................. 324/750 |
| 6,207,468 B1 | * | 3/2001 | Chacon et al. .................. 324/765 |
| 6,249,139 B1 | * | 6/2001 | Fu et al. .................. 324/765 |
| 6,255,128 B1 | * | 7/2001 | Chacon et al. .................. 438/14 |

FOREIGN PATENT DOCUMENTS

EP    0 304 632 A2    3/1989

OTHER PUBLICATIONS

DiMaria, "Defect Production, Degradation, and Breakdown of Silicon Dioxide Films," *Solid–State Electronics*, 41:957–965, 1997.

Lagowski et al., "Contact potential difference methods for full wafer characterization of oxidized silicon," *Inst. Phys. Conf. Serv.*, pp. 133–145, 1997.

Roy et al., "Non–Contact Characterization of Ultrathin Dielectrics for the Gigabit Era," *Electrochemical Society Proceedings*, 9712:280–295, 1997.

Schroder, "Semiconductor Material and Device Characterization," *Oxide Integrity*, pp. 388–403, 1998.

Vincent et al., "Dielectric Reliability in Deep–Submicron Technologies: From Thin to Ultrathin Oxides," *Microelectron. Reliab.*, 37:1499–1506, 1997.

(List continued on next page.)

*Primary Examiner*—Kamand Cuneo
*Assistant Examiner*—Jermele Hollington
(74) *Attorney, Agent, or Firm*—Fish & Richardson P.C.

(57) ABSTRACT

SILC characteristics and density of GOI defects of silicon wafers with thin dielectric films (e.g. $SiO_2$) are determined using a non-contact method that does not require any test structures on the wafer. The method includes stressing a dielectric with a corona discharge and measuring the dielectric current-dielectric voltage (I-V) characteristics by monitoring under illumination the corona charge neutralization after stress. An I-V measurement done as function of corona fluence gives SILC characteristics of the wafer. The SILC characteristics are then compared at a constant dielectric field to provide a measure of GOI defect density. The I-V characteristic corresponding to low fluence that does not generate measurable SILC are used to determine a thickness of dielectric film.

30 Claims, 11 Drawing Sheets

OTHER PUBLICATIONS

Weinberg et al., "High–field transport in $SiO_2$ on silicon induced by corona charging of the unmetallized surface," *Journal of Applied Physics*, 47:248–255, 1976.

Wolters et al., "Breakdown and Wear–Out Phenomena in $SiO_2$ Films," *Instabilities in Silicon Devices: Silicon Passivation and Related Instabilities*, 1:315–362, 1986.

Abstract: Japanese Application No. 09357095, filed Dec. 25, 1997, Publication No. 11186351, Publication Date: Jul. 9, 1999, "Method and Device for Evaluating Insulating Film and Process Evaluation Method", Applicant: Matsushita Electron Corporation.

DeBusk et al., "Fast noncontact diffusion–process monitoring", Solid State Technology, Apr. 1999.

Hoff et al., "COCOS oxide film characterization and monitoring", Part of the SPIE Conference on In–Line Methods and Monitors for Process and Yield Improvement, Sep. 1999, SPIE vol. 3884, pp. 207–215.

Wilson et al., "Study of Stress–Induced Leakage Current in Thin Oxides Stressed by Corona Charging in Air: Relationship of GOI Defects", Mat. Res. Soc. Symp. Proc., vol. 592, 2000, pp. 345–350.

Wilson et al., "New COCOS (Corona Oxide Characterization of Semiconductor) Method for Monitoring the Reliability of Thin Gate Oxides", Electrochemical Society Proceedings, vol. 99–16, 1999, pp. 373–384.

Wilson et al., "COCOS (Corona Oxide Characterization of Semiconductor) Metrology: Physical Principles and Applications", Gate Electricity Integrity, 1999, pp. 74–90.

* cited by examiner

METHOD FOR MEASURING STRESS INDUCED LEAKAGE CURRENT AND GATE DIELECTRIC INTEGRITY USING CORONA DISCHARGE

BACKGROUND OF THE INVENTION

The invention is related to semiconductor wafer testing and more particularly to characterization of a dielectric film on a semiconductor wafer.

As is known in the art, semiconductor devices often contain dielectric films (e.g., silicon dioxide) grown/or deposited on a semiconductor substrate (e.g., silicon). In many devices dielectric films are sandwiched between a semiconductor and a conducting gate metal electrode to form a MOS capacitor. Contaminants and other defects at the semiconductor/dielectric interface can cause premature electrical breakdown of the gate dielectric, e.g., oxide, film or increase the leakage current across the dielectric, thus deteriorating performance of memory chips and other integrated circuits. For example, such defects can originate from precipitating impurities such as metals, often introduced during oxidation processing, plasma deposition or etching or other processing. The defects also can be formed by stacking faults, interface microroughness, and crystal originated particulates (COPs). The defects are commonly referred to as the gate oxide integrity defects (GOI's).

Testing of oxide integrity (or more generally dielectric integrity) and reliability is one of the most expensive and cumbersome tests performed in an integrated circuit fabrication process. Such testing requires a large number of metal-insulator-semiconductors (MIS) or metal-oxide semiconductor (MOS) test devices on the wafers, which are expensive to fabricate and consume a large amount of time to test.

One form of testing gate dielectric/oxide reliability includes measuring the stress-induced leakage current (SILC). SILC is a major concern for modern MOS memory devices. This measurement includes stressing the relatively thin gate dielectric films by inducing flow of electric current across the dielectric. In the prior art, tests required forming MOS or MIS test capacitors on the wafer. To monitor GOI defects, the stress was then applied co capacitors until electrical breakdown took place. The MOS and MIS test capacitors are expensive and time consuming to fabricate. In addition, testing until the breakdown occurs often takes a long period of time.

SUMMARY OF THE INVENTION

The present invention describes testing of the dielectric film on a semiconductor substrate wafer prior to fabrication of the conducting gate. The dielectric film is tested by depositing a positive ionic charge (i.e., by corona discharge in air) on the surface of the dielectric film and then measuring the characteristics of the electron current as electrons tunnel into the dielectric from an underlying semiconductor substrate wafer. In this method, corona stress causes large dielectric leakage without the dielectric film necessarily breaking down. This stress induced leakage current (SILC) extends to low electric fields and its magnitude provides a measure of the GOI defects (or gate dielectric integrity defects).

The present invention features a non-contacting method for characterizing a semiconductor wafer having a dielectric or more specifically an oxide layer disposed thereon. For example, the dielectric layer can be characterized for its Gate Oxide Integrity (GOI) and Stress Induced Leakage Current (SILC) characteristics. As used herein, the term "dielectric" includes but is not limited to oxides, e.g., $SiO_2$, $Ta_2O_5$, $Al_2O_3$, nitrides, e.g., $Si_3N_4$, and barium strontium titanate (BST). Additionally, the term "GOI" refers to the integrity of the dielectric layer or film on the semiconductor substrate wafer.

In a general aspect of the invention, the method includes positioning a semiconductor wafer, having a dielectric layer disposed thereon, relative to a test device for applications of corona charge on the dielectric surface, and measuring the electric current across the dielectric layer after application of charge with the measurement test device spaced from the dielectric layer and the semiconductor wafer. The measurement test device can be for example, a vibrating Kelvin probe or a Monroe probe. The corona stress element of the test device may include a needle-type, a wire-type corona, or multiple needle-type and/or wire-type corona discharge electrode spaced from the dielectric layer. The positive corona charge applied to the surface of the dielectric on the semiconductor substrate stresses the dielectric layer causing a tunneling current between the semiconductor substrate and the dielectric layer. The amount of stress is controlled by the amount of corona charge, i.e., fluence ($C/cm^2$), deposited on the dielectric layer. For extra-low fluence, typically $\leq 2\times 10^{-6}$ $C/cm^2$, for a $SiO_2$ film on silicon, the method provides data on the initial tunneling characteristic and provides a means for measuring the electrical dielectric thickness $T_{ox}$ and the dielectric capacitance $C_{ox}$, where $C_{ox} = \epsilon_o \epsilon_{ox}/T_{ox}$ and $\epsilon_o$ is the permittivity in vacuum and $\epsilon_{ox}$ is the dielectric constant of dielectric layer. For high fluence, typically of about $10^{-5}$ $C/cm^2$ or higher, the sequence produces data on corona stress induced leakage current, i.e., the sequence produces a tunneling current, and provides a means for measuring the gate oxide integrity. The specific low and high fluence values may be different for dielectric layers other than $SiO_2$ and semiconductor substrates other than silicon. In general, a high amount of stress, i.e., fluence, is applied to the dielectric layer to induce a tunnelling current at about room temperature.

The measurement test device being spaced from the dielectric layer, advantageously provides a non-contacting approach for characterizing the wafer. Because the measurement test device does not contact the wafer, the approach is non-destructive so that, in many cases, tested semiconductor substrate wafers can be reused. The method also does not require test structure preparation thereby reducing the cost of testing. The method is also very fast and suitable for mapping the entire wafer surface and providing an advantage of rapid feedback of test results to manufacturing.

In another aspect, the invention features a method of characterizing dielectric layer disposed on a semiconductor wafer. The method includes positioning the semiconductor wafer relative to a test device and measuring, with the test device, the stress induced leakage current characteristic across the dielectric layer on the semiconductor wafer with the test device spaced from the dielectric layer and the semiconductor wafer. The stress induced leakage current characteristic is a current density across the dielectric versus a dielectric field for a specific fluence of stress on the dielectric layer.

Embodiments of this aspect of the invention can include one or more of the following. Measuring the stress induced leakage current includes using the measurement test device to apply a charge to the dielectric layer of the semiconductor wafer at a level sufficient to stress the dielectric layer by causing a tunneling current flow across the dielectric, and measuring a current-voltage (I-V) characteristic after stressing the dielectric layer. The current, I, is the electric current density flowing across the dielectric and the voltage, V, is the dielectric voltage, i.e., the voltage drop across the dielectric. The dielectric layer of the semiconductor wafer is illuminated while measuring the stress induced leakage current, e.g., while measuring the current-voltage characteristic, to reduce the surface barrier contribution to the stress induced leakage current. The dielectric surface of the semiconductor wafer is also illuminated while applying the charge to the dielectric layer to further reduce the surface barrier contribution to the stress induced leakage current during subsequent measurement. The charge is applied to the dielectric layer of the semiconductor wafer with a corona stress element. Measuring the current-voltage characteristic includes measuring a surface potential difference between a probe and the dielectric layer on the semiconductor wafer, i.e., the contact potential difference, and the current density across the dielectric layer. The semiconductor wafer is silicon wafer having a dielectric layer, e.g., $SiO_2$.

Measuring the stress induced leakage current may include a precharging of a portion, e.g., an entire, a half, or a small segment including the testing site, of the dielectric layer with a charge of positive polarity and after that, applying additional positive charge on the testing site only, stressing this site, and measuring the I-V characteristic representative for this test site to determine the stress induced leakage current.

In another aspect, the invention features a method of measuring gate oxide integrity of a dielectric layer disposed on a semiconductor wafer. The method includes illuminating the dielectric layer to remove voltage drop across the semiconductor space charged region of the semiconductor wafer, e.g., during the entire measuring cycle, applying a charge to the dielectric layer at a level sufficient to stress the semiconductor wafer to induce a tunneling current flow, and measuring a current-voltage characteristic of the semiconductor wafer after applying the charge to the dielectric layer.

Embodiments of this aspect of the invention can include one or more of the following. Illuminating and applying charge to the dielectric layer are simultaneous. The method includes simultaneously illuminating and measuring a current-voltage characteristic of the semiconductor wafer. Illuminating and measuring a current-voltage characteristic of the semiconductor wafer are simultaneous. Applying the charge includes applying the charge to the dielectric layer of the semiconductor wafer with a corona stress element. Measuring the current-voltage characteristic includes calculating a current density across the dielectric layer from a measured time dependence of a surface potential difference between a probe and the semiconductor wafer. The semiconductor substrate can be made of any semiconductor. Typically, the semiconductor wafer is a silicon wafer including a dielectric film, e.g., $SiO_2$. Measuring the current-voltage characteristic includes precharging the dielectric layer of the semiconductor wafer. The method further includes correcting the measured current-voltage characteristic for a work function effect, i.e., the work function difference between the reference electrode and the semiconductor wafer.

In another aspect, the invention features a method of measuring a thickness of a dielectric layer disposed on a semiconductor wafer. The method includes applying a charge to the dielectric layer at a level sufficient to stress the semiconductor wafer to produce a tunneling current between the semiconductor wafer and the dielectric layer, e.g., to about $2\times10^{-6}$ C/cm$^2$, the tunneling current being related to the thickness of the dielectric layer, measuring a current-voltage characteristic of the semiconductor wafer after applying the charge to the dielectric layer, calculating an oxide current density as a function of dielectric field, and determining the dielectric thickness from the calculated dielectric current density and dielectric field.

In another aspect, the invention features a method of measuring gate oxide integrity of a semiconductor wafer having a dielectric layer thereon. The method includes moving the wafer into position below a charge source, illuminating an area of the wafer under the source with a first light source, setting charging conditions of the charge source, turning on the charge source to stress the area of the wafer, turning off the charge source and the first light source, moving a probe above the wafer over the area stressed by the charge source, illuminating the area of the wafer under the probe with a second light source, measuring the contact potential as a function of time after turning off the charge source, and calculating dielectric current density as a function of dielectric field.

The method can fur her include determining a magnitude of a stress induced leakage current at a constant dielectric field.

The method also can include determining a magnitude of a stress induced leakage current, SILC, at a constant dielectric field and at a constant stress fluence value, and comparing the SILC values at different test sites on one or many semiconductor substrate wafers in order to determine corresponding values of GOI defect density.

In another aspect, the invention features a method of measuring the gate oxide integrity of a semiconductor having a dielectric layer thereon. The method includes measuring the stress induced leakage current across the dielectric layer on the wafer, induced by a known value of a stress fluence, determining a magnitude of a stress induced leakage current at a constant field strength, and comparing the magnitude of stress induced leakage current to that of a standard dielectric with the same thickness and with known GOI defect density.

The method can further include determining the thickness of the dielectric layer.

DETAILED DESCRIPTION

Figure 1:
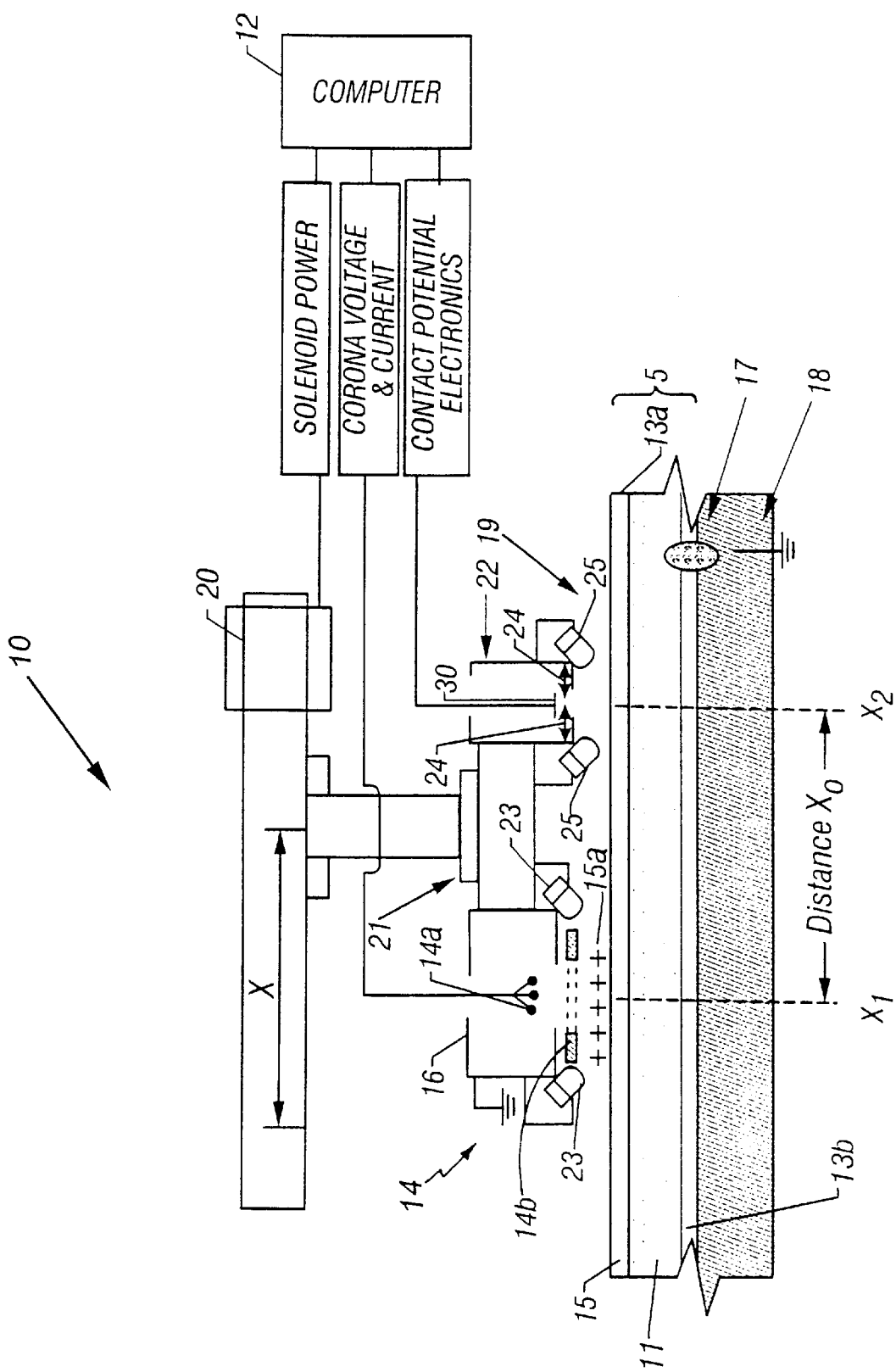
FIG. 1 is a schematic representation of a wafer measurement system.

Referring to FIG. 1, a computer controlled test system 10 is used to measure the gate oxide integrity (GOI) and stress-induced leakage current (SILC) characteristics of a top dielectric layer 13a placed on a semiconductor wafer 5 on a testing site 15a. Semiconducting wafer 5 includes a semiconductor substrate wafer 11 (e.g., silicon) disposed between overlying and underlying dielectric layers (e.g., $SiO_2$, $Ta_2O_5$, $Al_2O_3$, $Si_3N_4$, and barium strontium titanate (BST)) 13a, 13b. Semiconductor substrate wafer 11 is connected to the ground potential via a back-contact device 17 in electrical contact with grounded wafer chuck 18. Test system 10 measures the GOI and SILC by depositing electric charge onto a surface 15 of top dielectric layer 13a, and then monitoring the charge neutralization due to current flow through this dielectric layer into or from semiconductor substrate wafer 11.

Test system 10 includes a computer 12 that controls components of the system to apply electric charge to and measure charge neutralization of testing site 15a. Computer 12 also calculates parameters representative of the GOI and SILC of testing site 15a. The system 10 includes a testing device that contains a charging station 14 and a charge measuring station 19 both of which are translatable, using a solenoid 20, relative to a chuck 18.

Wafer 5 is held, e.g., by vacuum suction, onto chuck 18, which is formed of an electrically conductive material (e.g, aluminum) and is connected to ground potential. A back-contact device 17 protrudes through dielectric layer 13b making electrical contact to semiconductor substrate wafer 11, and connecting it to the ground potential. An example of a back-contact device capable of protruding through dielectric layer 13b can be found in U.S. patent application Ser. No. 09/295,919, now U.S. Pat. No. 6,114,865, by Lagowski et al. which is incorporated herein in its entirety by reference. Chuck 18 is mounted on a moveable stage (not shown in FIG. 1) which can position wafer 11 under charging station 14 ($X_1$-position) and charge measuring station 19 ($X_2$-position). Charging station 14 and the charge measuring station 19 are spaced apart from each other on a mount 21 at a fixed distance $X_0$, e.g., about 2 cm, between their centers. Solenoid 20 is used to translate charging station 14 and measuring station 19 by a distance $X_0$ such that the measuring station is precisely above the wafer at the $X_1$-position, i.e., the position previously occupied by the charging station.

Charging station 14 includes a corona discharge source 16 and a light source 23. Corona discharge source 16 includes a corona charging wire 14a which receives a high voltage potential of either a positive or negative polarity as needed and a corona-confining ring 14b, e.g., a metal ring, held at ground potential so that corona charge is deposited on a surface 15 of dielectric layer 13a preferably within a radius of about 6 to about 10 mm. Charging station 14 is able to produce a controlled ionic discharge current suitable for depositing charge ranging from about $10^{-7}$ to about $10^{-4}$ A/cm$^2$ in a time period typically shorter than 200 seconds which results in a measurable tunneling current flow across dielectric layer 13a. For tunneling current measurements of electrons injected from semiconductor substrate wafer 11 into dielectric layer 13a, test system 10 uses a positive corona charging rather than a negative corona charging. A negative corona stress can cause growth of an add tonal oxide film during stressing and can also generate a positively charged traps in the oxide that cause nonuniform electric field in the oxide. Non-uniform oxide field produces large errors in determining the tunneling oxide thickness.

Charge measuring station 19 includes a light source 25 and a contact potential sensor 22, such as a Kelvin probe or a Monroe-type probe, which is used to measure the contact potential of dielectric layer 13a with respect to a reference electrode 30, i.e., the contact potential difference $V_{cp}$ respectively. Sensors of these types are described, respectively, in G. W. Reedyk and M. M. Perlman: Journal of the Electrochemical Society, Vol. 115, p. 49 (1968); and in R. E. Vosteen: Conference Records, 1974 IEEE-IAS 9th Annual Meeting, p. 799, the entire contents of which are incorporated herein by reference. An example of a commercially available device is the Isoprobe model 162 by Monroe Electronics, Lyndonville, N.Y. 14098. Typically, electrode 30 is separated from the top surface of the dielectric film by an air gap of about fraction of about a millimeter. The change of the contact potential difference, $\Delta V_{cb}$, caused by a dose of corona charge on the wafer's surface is equal to the change in the voltage drop across the dielectric layer ($\Delta V_{ox}$) plus the change in the surface barrier ($\Delta V_{sb}$);

$$\Delta V_{cb} = \Delta V_{ox} + \Delta V_{sb}$$

The dielectric voltage $V_{ox}$ decays with time, t, after charging, i.e., $V_{ox} = V_{ox}(t)$, due to a neutralization of charge by current, J(t), flowing across the dielectric.

Test system 10 calculates the current density, J from the expression $$J = C_{ox}(dV_{ox}/dt)$$

where $C_{ox}$ is the dielectric capacitance, i.e., $C_{ox} = (\epsilon_o \epsilon_{ox} / T_{ox})$, $\epsilon_o$ is the permittivity of free space, $\epsilon_{ox}$ is the permittivity of the dielectric film, and $T_{ox}$ is the oxide thickness. The current-voltage (I-V) characteristic is then obtained by taking I equal to the current density J, and V equal to a corresponding value of dielectric voltage, $V_{ox}$. The electric field, $E_{ox}$, in dielectric corresponding to a given $V_{ox}$ is $E_{ox} = V_{ox}/T_{ox}$. The method gives a set of three corresponding values (J, $V_{ox}$, and $E_{ox}$) determined for the same time, t, after termination of charging. If dielectric thickness is not known it is determined from I-V characteristic measured at very low corona stress as discussed later on. Using illumination, the measured values of $V_{cp}$ as a function of time are made equal to $V_{ox}$ as a function of time by reducing the contribution from the surface barrier $V_{sb}$ to zero, i.e., $\Delta V_{cb} = \Delta V_{ox}$. The $V_{cp}$ under illumination is also denoted as $V_{cp}^{ill}$.

Test system 10 includes light sources 23, 25, preferably blue light emitting diodes, to illuminate testing site 15a during charging (light source 23) and during measuring (light source 25) thereby reducing $V_{sb}$ to about zero. Illuminating the dielectric surface is especially necessary in the case of positive charging of an oxide, e.g., $SiO_2$, on the most frequently used substrate in IC-fabrication, i.e., p-type silicon. This specific case of $SiO_2$ film on p-type Si substrate is used as an example for illustration of the method. For p-type silicon substrates, positive corona charge creates a very large depletion layer surface barrier, $V_{sb}$, ranging from 10 to 200 volts, which decays slowly after terminating corona charge. Illuminating test site 15a efficiently generates excess minority carriers (electrons in the p-type Si) in a silicon depletion layer beneath the $Si/SiO_2$ interface to approximately eliminate the surface barrier contribution to $V_{cp}$. With illumination, $V_{cp}^{ill}$ is approximately equal to $V_{ox}$, and $V_{cp}^{ill}$ can be used to calculate the current density and oxide, i.e., dielectric, field. Without illumination, the potential drop would dominate in contact potential measurements preventing reliable measurement of the oxide current characteristic. For p-type silicon, light with a wavelength less than 1,000 nm produces electron-hole pairs to suppress $V_{sb}$. Typically, the green and blue diodes emit light at about 400 nm to about 350 nm. Shorter wavelengths of light are not desired since they can cause photoconductivity of the dielectric layer and thereby alter the I-V characteristics. In general, the green and blue diodes emit light of sufficient energy and intensity to substantially reduce $V_{sb}$ such that $V_{cp}^{ill}=V_{ox}$.

Figure 2A:
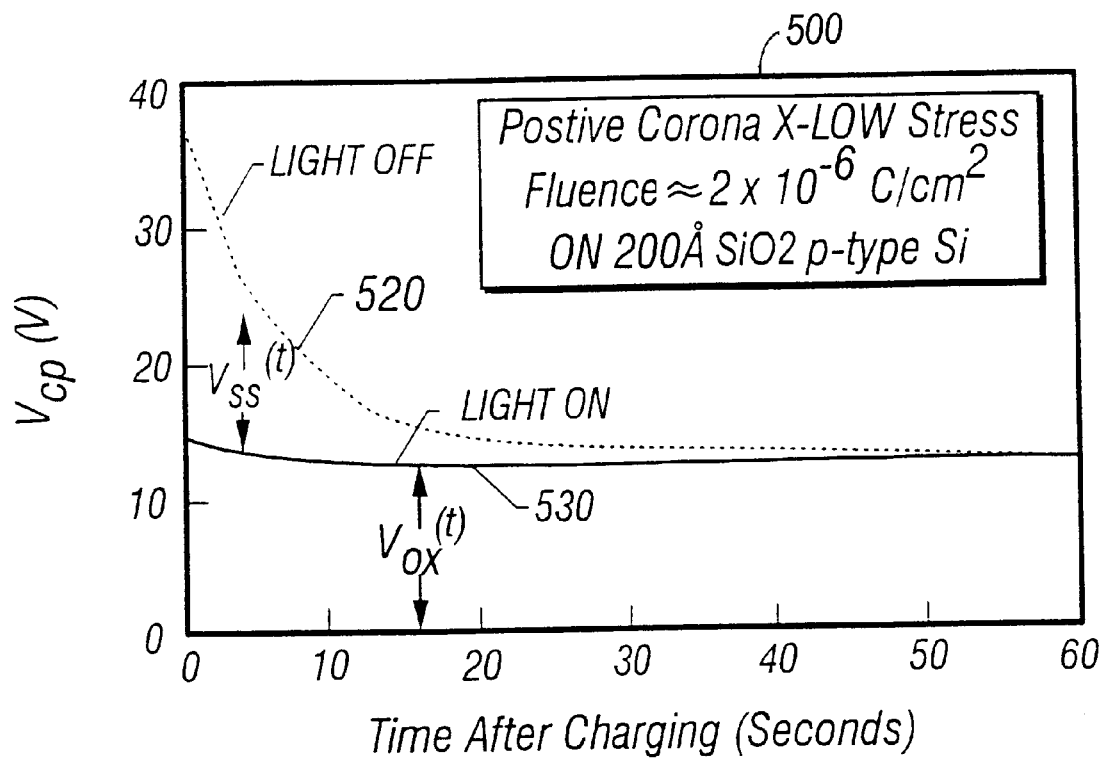
FIG. 2A is a graph of the contact potential decay.

Referring to FIG. 2A, a graph 500 illustrates the effect of illuminating the testing site surface. Graph 500 includes contact potential decay data collected after terminating a positive corona charging pulse with fluence of about $2 \times 10^6 C$. Decay curve 520 corresponds to measurements performed in the dark (i.e., the light sources 23, 25 off), whereas decay curve 530 corresponds to measurements performed under illumination (i.e., light sources 23, 25 on). Without illumination, the large $V_{sb}$ leads to large deviations in calculating the current density, J, versus oxide field strength, $E_{ox}$.

Figure 2B:
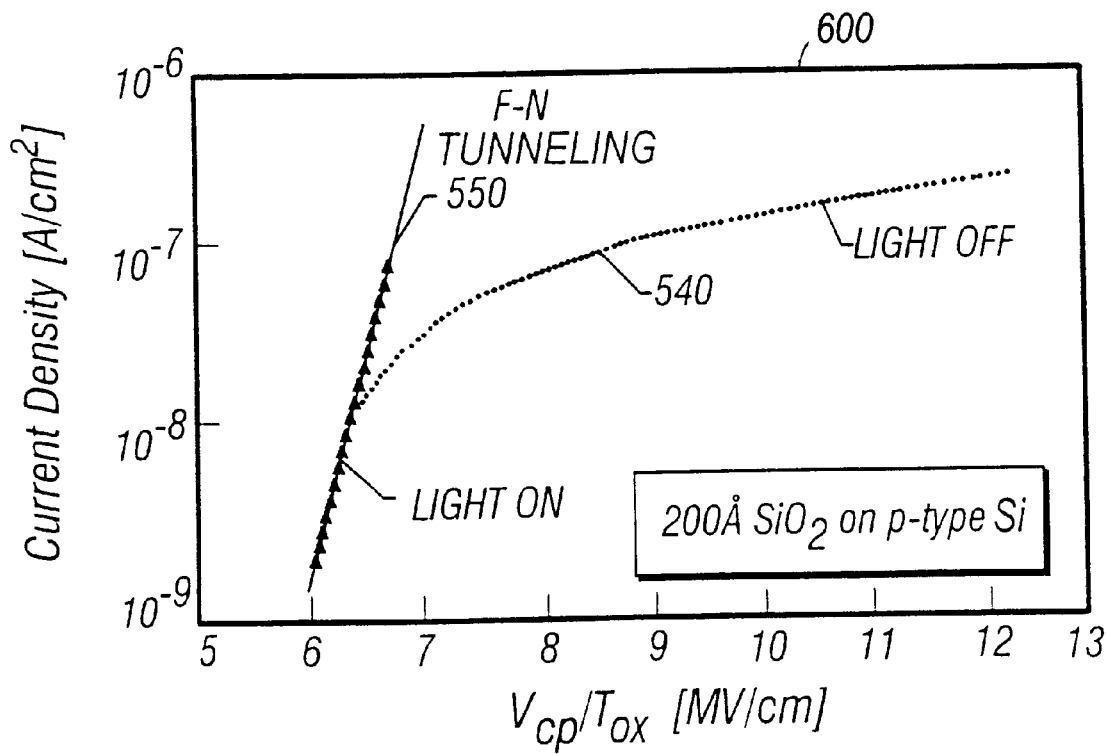
FIG. 2B is a graph of the current density, J, calculated from the contact potential decays of FIG. 2A.

Referring to FIG. 2B, a graph 600 of current density versus oxide field strength includes a curve 540 calculated with the data from curve 520 and a curve 550 calculated with the data from curve 530. Curve 550 is in excellent agreement with a theoretical tunneling current, e.g., Fowler-Norheim (F-N) tunneling current, characteristic for electrons tunneling from silicon into the $SiO_2$ conduction band. Due to the large $V_{sb}$ in the data from curve 520, part of the curve 540 deviates from the theoretical tunneling current at high current values and thus is not useful in interpreting the SILC and GOI characteristics of the silicon wafer.

In operation, computer 12 sends a signal to move chuck 18 into position below charging station 14. Computer 12 presets these charging conditions, such as ionic current and charging duration, (i.e., the fluence value determined by a charging current multiplied by the charge time) and sends signals to activate the charging station's light source 23 and to activate the corona discharge source 16. After depositing the charge onto testing site 15a of dielectric surface 15, computer 12 sends signals to turn the discharge source off, to turn on the charge measuring station's light source, to turn off the discharge station's light source, and to move the charge measuring station, via the solenoid, to position the contact potential sensor above the charged surface of the wafer, i.e., above testing site 15a. This set of operations is done fast enough, e.g., typically about 50 milliseconds, to reduce the amount of charge neutralized prior to starting the measurement.

Once measuring station 19 is above charged testing site 15a, the computer acquires the measured data of the contact potential under illumination, $V_{cp}^{ill}$ vs. time, t, calculates the time derivative of $V_{cp}^{ill}$ and the oxide current density $J=C_{ox}$ $(dV_{cp}^{ill}/dt)$ as a function of the oxide field, $E_{ox}$, where $E_{ox}$ is equal to $V_{cp}^{ill}/T_{ox}$, and $T_{ox}$ is the nominal thickness of the dielectric layer either introduced into the computer by the operator or a preliminary default thickness value, i.e., 100 Å, used by the computer. After measuring the contact potential for a desired time, i.e., long enough to measure the contact potential for a wide spectrum of oxide fields, the computer sends a signal to the charge measuring station to terminate $V_{cp}^{ill}$ monitoring.

Figure 3:
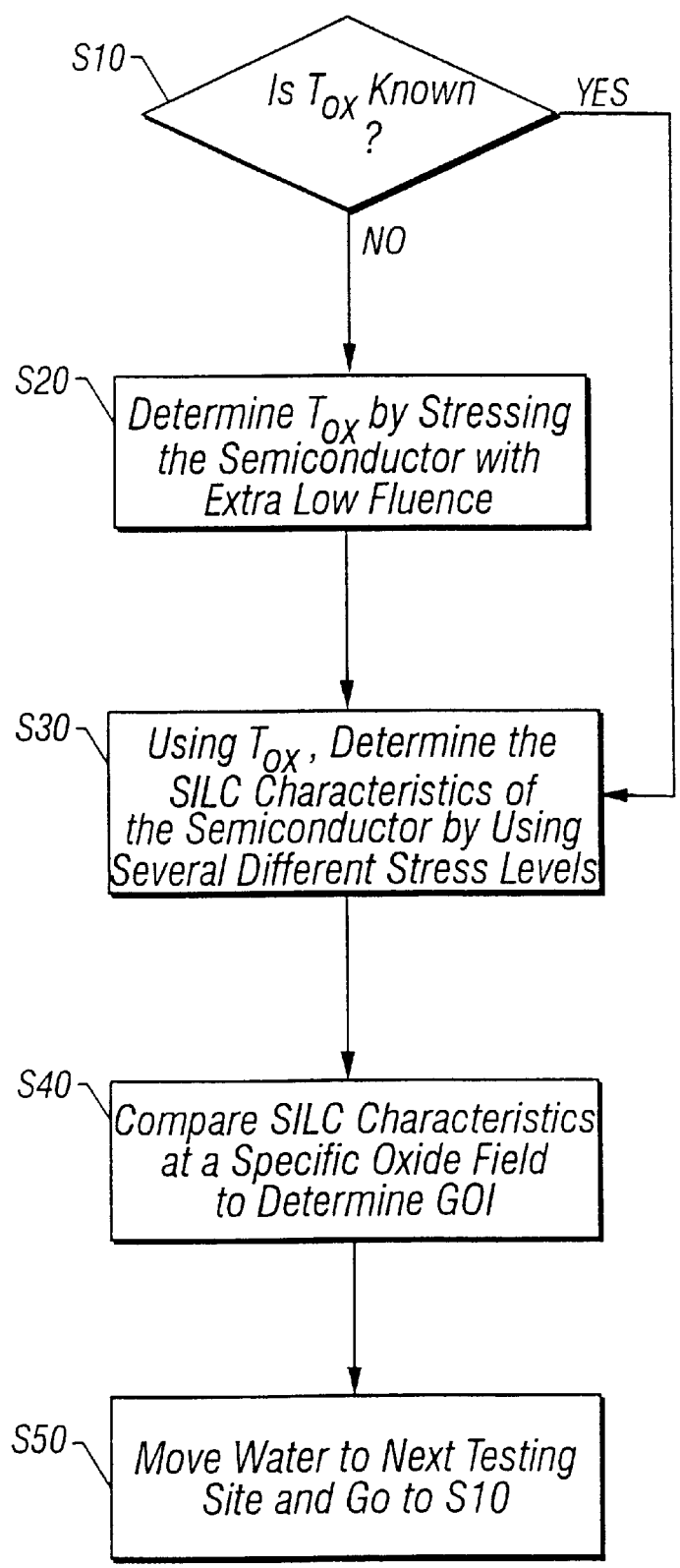
FIG. 3 is a flow diagram of a method of determining SILC and GOI.

Referring to FIG. 3, if the oxide thickness is unknown (S10), extra-low corona stress fluence is used, i.e., $\leq 2 \times 10^{-6}$ $C/cm^2$, to produce tunneling current with no measurable stress induced leakage current (S20). Computer 12 fits this contact potential data to a theoretical tunneling expression, e.g., Fowler-Norheim or other analytical expressions, and calculates an oxide thickness as a best-fitting parameter. The computer then uses the calculated oxide thickness value, $T_{ox}^{FN}$, in subsequent calculations of current density and electric oxide fields (S30–S50). Alternatively, the oxide thickness, $T_{ox}$, can be determined by other methods know in the art and input into the computer by the user. The computer uses the input $T_{ox}$ value in calculating the current density and electric oxide field.

The computer restarts the charging and measuring sequence by sending simultaneous signals to the solenoid and the translatable chuck causing the solenoid to move the charging station back to the $X_1$-position and the stress measurement sequence is repeated using a second larger corona stress fluence suitable to cause the appearance of the stress induced leakage current, i.e., a fluence typically $>10^{-5}$ $C/cm^2$. From the collected contact potential versus time data, the current versus the oxide field is calculated using the oxide thickness, $T_{ox}^{FN}$, determined from the extra-low fluence measurement or input by the user.

The cycle of stressing the oxide and measuring the contact potential can be repeated for higher stress fluences and the resulting data used to determine SILC Characteristics S30 and GOI S40 of the testing site, as described in detail below. After completing the measurements on one testing site, the wafer chuck translates the wafer and the charging/measuring cycle is performed on the a new testing site S50. The sequence continues until all selected sites on the wafer are measured.

The basic measurement sequence has two important implementations which depend on the corona charge fluence. For extra-low fluence, typically $\leq 2 \times 10^{-6}$ $C/cm^2$, (i.e. negligible corona stress and thus a negligible SILC), the sequence provides data on the initial tunneling characteristic and provides a means for measuring the electrical oxide thickness $T_{ox}^{FN}$ and the oxide capacitance $C_{ox}$, where $C_{ox}= \in_o \in_{ox}/T_{ox}$ and $\in_o$ is the permittivity in vacuum and $\in_{ox}$ is the dielectric constant of oxide. For high fluence, typically of about $10^{-4}$ $C/cm^2$ or higher, the sequence produces data on corona stress induced leakage current and provides a means for measuring the magnitude of SILC and also for determining the gate oxide integrity (GOI). In general, a high amount of stress, i.e., fluence, is applied to the dielectric layer to induce a tunnelling current at about room temperature.

Tunneling Current and Corona Stress

System 10 uses positive charging of the dielectric surface to produce stress induced leakage current. Monitoring the magnitude of the stress induced current provides a measure of the SILC which by itself is an important parameter. The magnitude of SILC at constant stress and constant dielectric field is, in turn, used to characterize the GOI defects.

Deposition of an ionic charge, $\Delta Q_c$, on the oxide surface, produces a change of oxide electric field, $\Delta E_{ox}$, that according to Gauss's law is:

$$\Delta E_{ox} = (\epsilon_o \epsilon_{ox}) \cdot \Delta Qc.$$

For low $\Delta Q_c$, values, and thus low field values, there is virtually no charge dissipation across the oxide into the silicon and into the ground. With increasing positive corona charge, the electric field in the oxide increases until the oxide conduction band matches the silicon conduction band at a distance from the Si/SiO$_2$ interface small enough (about 50 Å or less) to produce a noticeable electron tunneling current flow across the oxide. For electron tunneling in Si/SiO$_2$ materials, the electron tunneling current from the semiconductor into and across the oxide, typically, exceeds about 10$^9$ A/cm$^2$ when the oxide field exceeds about 6 MV/cm. For oxides of about 40 Å or thicker, this current is described by the Fowler-Nordheim (F-N) equation $$J_{F-N} = A \cdot E_{ox}^2 \cdot EXP(-B/E_{ox})$$

where A and B are parameters with well-known values for SiO$_2$. For a SiO$_2$ film on silicon, A is $1.746 \times 10^{-6}$ and B is $2.29 \times 10^8$. $J_{F-N}$ is expressed in units of A/cm$^2$ and $E_{ox}$ is in V/cm. The build up of ionic charge on oxide surface stops when the tunneling current becomes equal to the corona ionic flux arriving on the surface. In other words, when $J_{F-N} = J_c$, there is a steady-state between the current deposition density and the tunneling current density. This steady-state condition can be described by any one of the following interrelated parameters: the oxide charge $\Delta Q_c^{st}$; the oxide field $E_{ox}^{st}$, and the oxide voltage $V_{ox}^{st}$. After ceasing the corona charging, charge on the surface of the oxide decays. The charge decay and the corresponding electric current can be monitored by measuring the contact potential decay. The current density decreases with time and it is calculated as $$J(t) = C_{ox} \cdot (dV_{ox}/dt) \approx C_{ox} \cdot (dV_{cp}^{ill}/dt)$$

where illuminating the semiconductor substrate near the Si/SiO$_2$ interface is required to assure the equalities $$\Delta V_{cp}^{ill} = \Delta V_{ox}$$

and $$(dV_{ox}/dt) = (dV_{cp}^{ill}/dt)$$

(As discussed in the previous section, in general, $\Delta V_{CP} = \Delta V_{ox} + \Delta V_{SB}$ where $\Delta V_{SB}$ is the semiconductor surface barrier).

During the corona stress, the steady-state condition is maintained for the stress duration $t_{stress}$. The parameter describing the stress is the corona fluence, $F_{stress}$, i.e., the product of corona current and $t_{stress}$;

$$F_{stress}[C/cm^2] = J_c \cdot t_{stress}.$$

Determining the Oxide Thicknesses

After depositing charge with low corona fluence, $F_{stress} < 10^{-6}$ C/cm$^2$, experimental data on $(dV_{cp}^{ill}/dt)$ vs. $V_{cp}^{ill}$ are collected by the computer. This data is converted into J verses $E_{ox}$ where an approximate value of $T_{ox}$ or a default value of 100 Å can be used in these calculations.

$$J = (dV_{cp}^{ill}/dt)(\epsilon_o \epsilon_{ox}/T_{ox}) \text{ and } E_{ox} = V_{cp}^{ill}/T_{ox}.$$

Since low fluence charging does not cause any measurable stress induced leakage current, the corresponding data of J verses $E_{ox}$ is used to calculate an oxide thickness by fitting, e.g., variational fitting procedures, the collected data to the Fowler-Nordheim expression to determine the exact value of the thickness oxide parameter $T_{ox} = T_{ox}^{FN \cdot T}{}_{ox}^{FN}$ is then used to recalculate new values of J and of $E_{ox}$.

Figure 4:
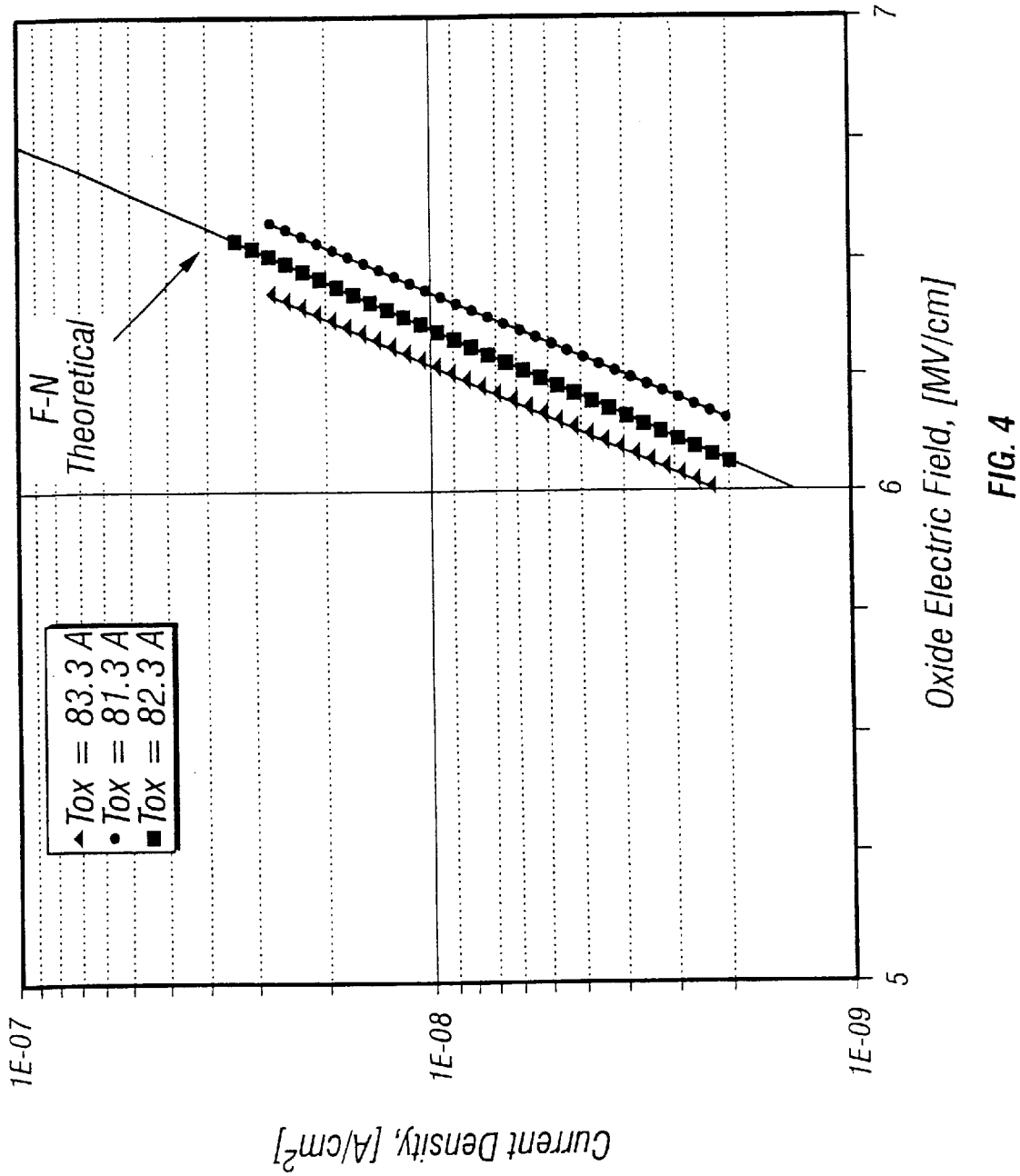
FIG. 4 is a graph of the current density at low corona fluence verse oxide electric field.

The result of low corona fluence deposited on a semiconductor substrate is plotted in a log J vs. $E_{ox}$ scale, as shown in FIG. 4. The best fit $T_{ox}$ value, (in this case 82.3 Å), is the calculated electrical oxide thickness. The accuracy of this method of calculating oxide film thickness is in the sub Å region and is illustrated by comparing two sets of data recalculated from F-N expression using $T_{ox}$ values differing from the best-fit $T_{ox}$ by ±1 Å.

Figure 5A:
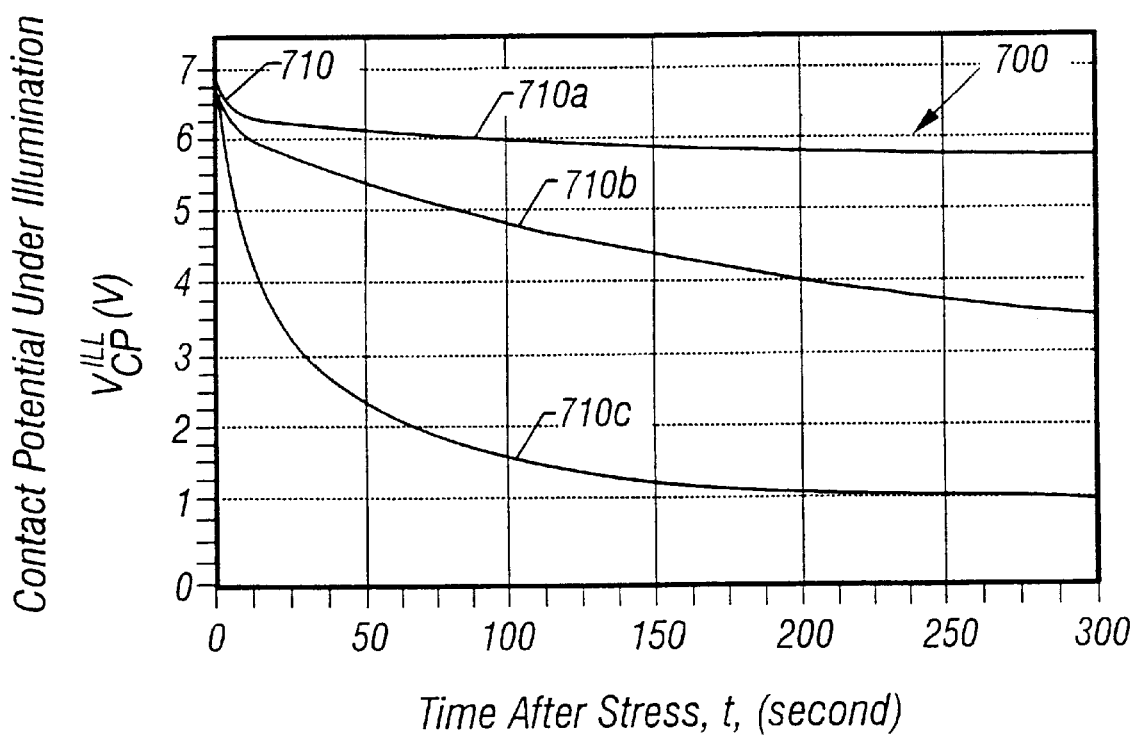
FIG. 5A is a graph of $V_{cp}^{ill}$ decay curves measured with illuminating the testing site.

Referring to FIG. 5A, a graph 700 includes $V_{cp}^{ill}$ decay curves 710 measured with illuminating the testing site. Decay curves 710 were taken after termination of the positive corona stress with: extra-low fluence of about $2 \times 10^{-6}$ C/cm$^2$ for curve 710a; medium fluence of about $1 \times 10^{-4}$ C/cm$^2$ for curve 710b; and high fluence of abort $3 \times 10^{-3}$ C/cm$^2$ for curve 710c. Measurements were conducted on p-type Si wafer having a 101 Å thick oxide layer.

Figure 5B:
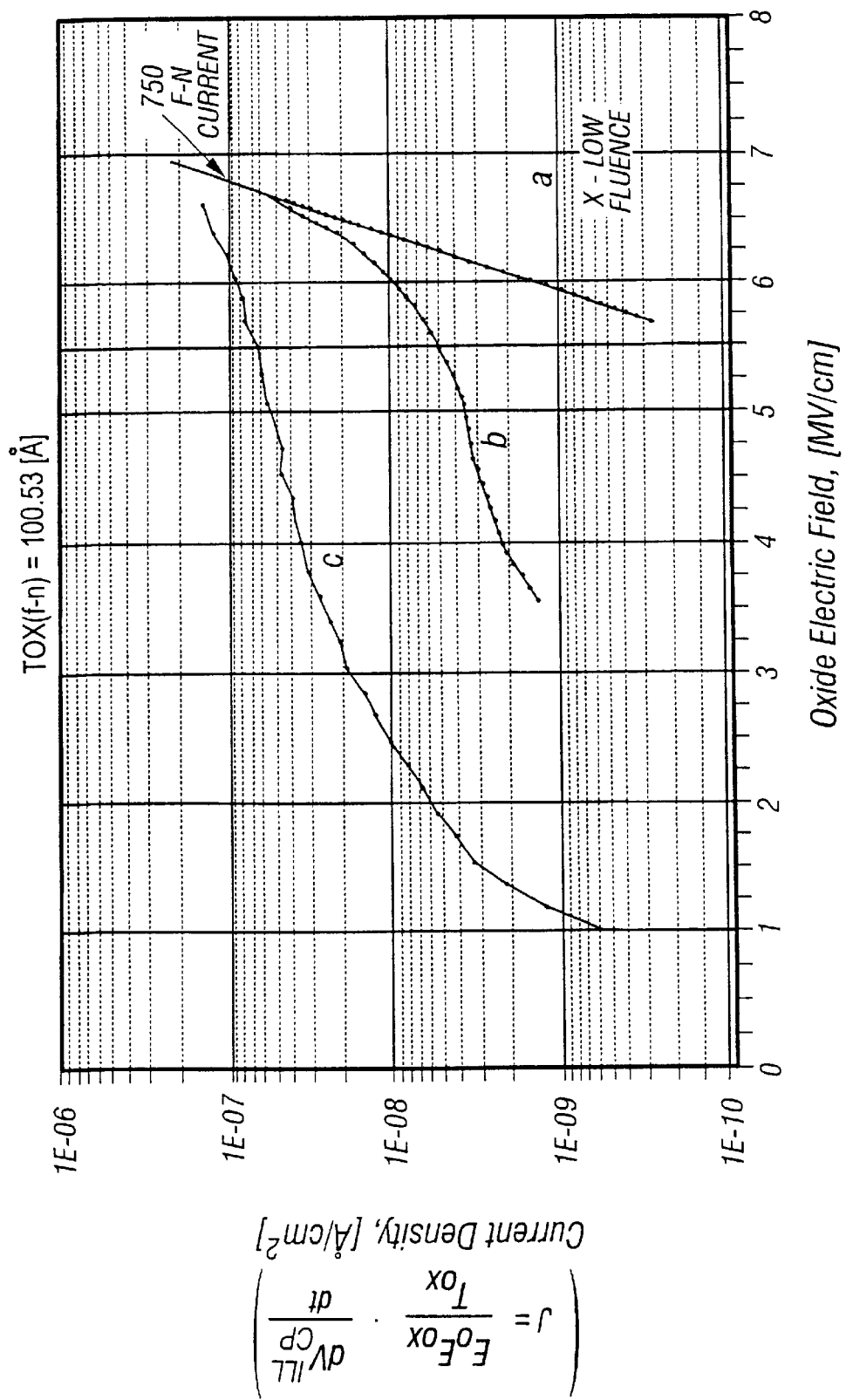
FIG. 5B is a graph of current density, J, plotted verses oxide field, $E_{ox}$, calculated from the corresponding contact potential decay curves of FIG. 5A.

FIG. 5B is a graph of current density, J, plotted verses oxide field, $E_{ox}$, calculated from decay curves 710 of FIG. 4A. A best fitting line 750 calculated using the Fowler-Nordheim electron tunneling expression from above is also shown with a solid line. The fitting gave a very precise tunneling oxide thickness $T_{ox}^{FN} = 100.53$ Å.

SILC and GOI Defects

Figure 6B:
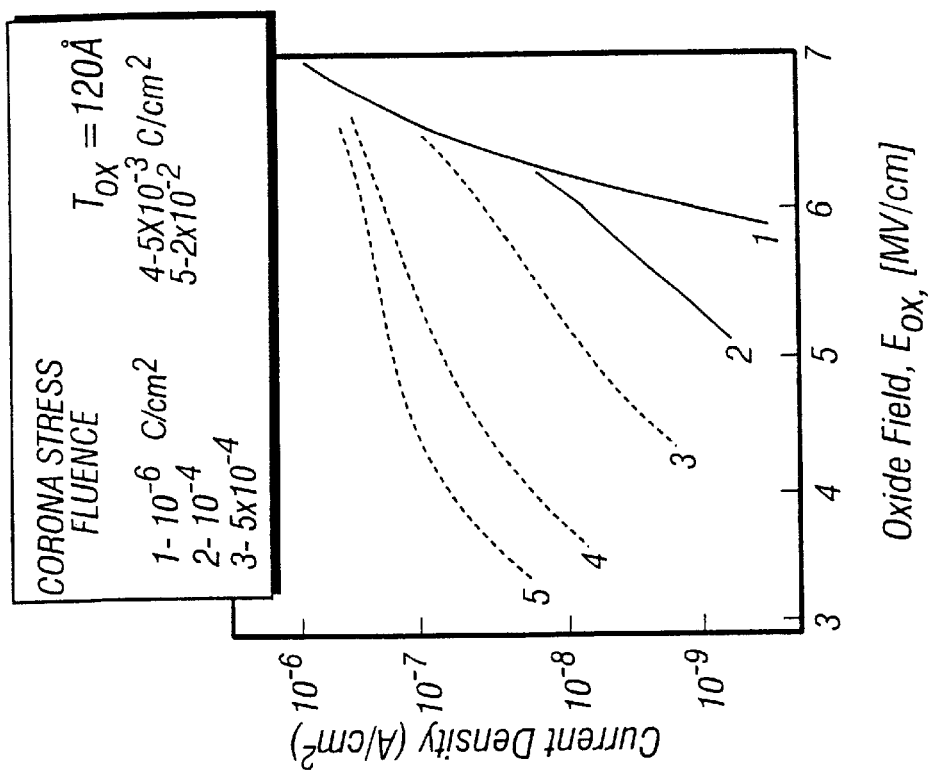
FIG. 6B is a graph of the SILC Characteristics of a semiconductor wafer having high levels of GOI defects related to interface microroughness.
Figure 6A:
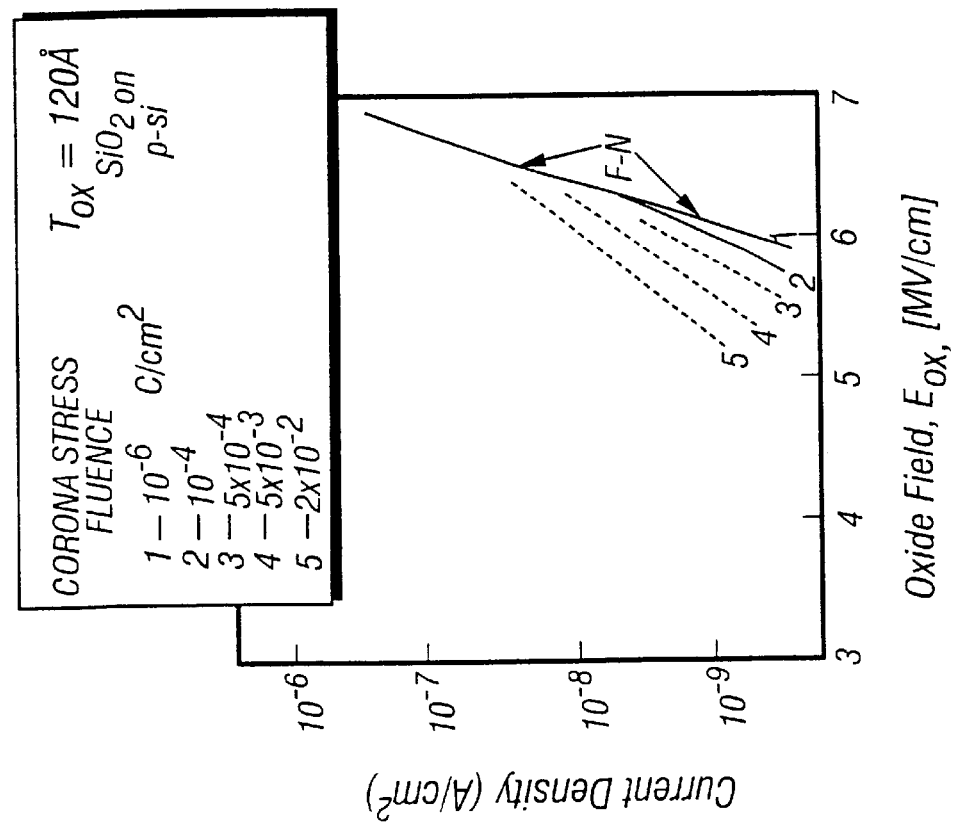
FIG. 6A is a graph of the SILC Characteristics of a wafer having low levels of GOI defects related to interface microroughness.

SILC is determined by repeating the measurement sequence described above for different corona fluence levels at the same site on the semiconductor wafer. For each corona fluence level, the current density, J, is calculated as a function of the oxide electric field, $E_{ox}$. Data for low corona fluence is used to determine the electrical oxide thickness which is then used along with the measured contact voltage decay to calculate SILC values, J, for each corona stress level. The set of curves for each different corona fluence represents the "SILC Characteristic" of the semiconductor wafer at the location of corona charging and contact potential measuring. The lower the SILC values, J, after stress the better the oxide integrity. For example, FIGS. 6A and 6B are graphs of J verse $E_{ox}$ of two different semiconductor wafers recorded with five different amounts of corona fluence. Note that the semiconductor wafer used in the tests shown in FIG. 6B contains a large density of GOI defect, whereas the wafer used in the tests shown in FIG. 6A contains a low density of GOI defect. These GOI defects originated from a different magnitude of the interface microroughness produced by chemical treatment of the wafer surface prior to oxidation, as commonly done in silicon IC fabrication cycles. Comparing FIG. 6A with FIG. 6B reveals that semiconductor wafers including a relatively lower amount of GOI defects have "SILC Characteristics" that differ from wafers including a fewer amount of GOI defects. For example, a large amount of GOI defect leads to a larger stress induced current density, for the same stress value. Furthermore, the large amount of GOI defect results in more tunneling, at lower oxide fields.

According to the present invention the gate oxide integrity defect density at different sites on a given wafer or for different wafers is obtained by comparing the SILC values at the same corona fluence and oxide field. Typically, the corona fluence, i.e., amount of charge deposited on the oxide surface, is both high enough so that low GOI densities can be detected and low enough to avoid saturating the current density so that any sensitivity to GOI density is lost.

Figure 7B:
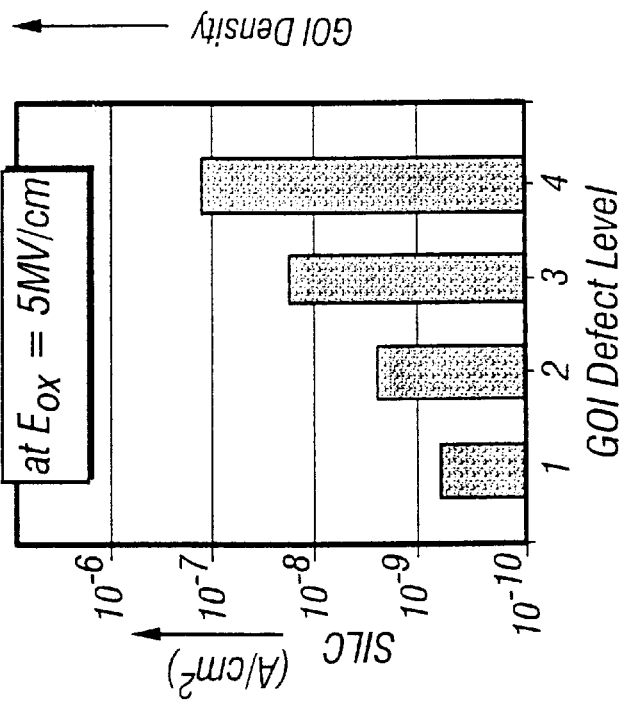
FIG. 7B is a graph of the SILC value for each semiconductor wafer of FIG. 7A at an oxide field of 5 MV/cm$^2$.
Figure 7A:
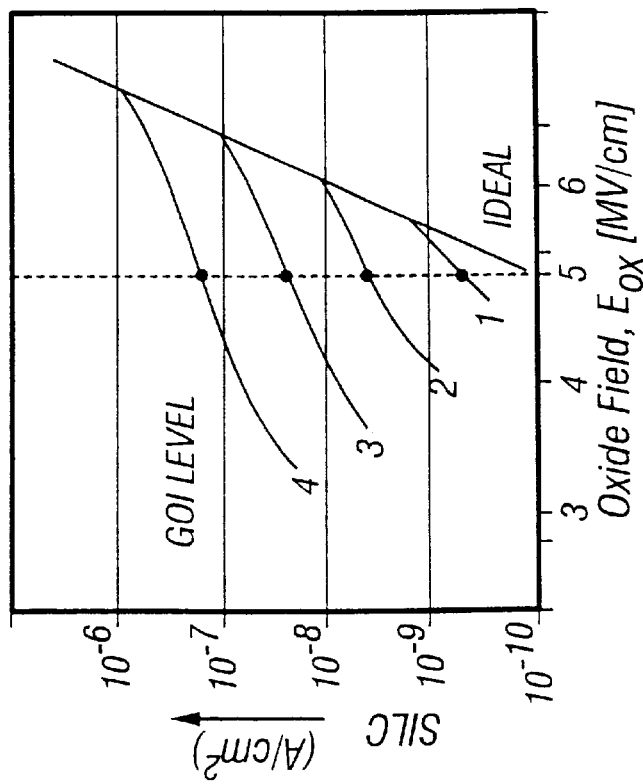
FIG. 7A is a graph of the SILC Characteristics of five semiconductor wafers each having different levels of GOI defect related to COP's (i.e., the crystal originating particles).

The procedure for determining GOI defect density is illustrated in FIGS. 7A and 7B, using an important case of GOI's related to COP defects, i.e., the crystal originated particles. In FIG. 7A, the SILC curves 1, 2, 3, and 4, each recorded at a corona fluence of $1\times10^{-3}$ C/cm$^2$, correspond to wafers having increasing GOI defect density, respectively. In FIG. 7B, the SILC values for each wafer at $E_{ox}$=5 MV/cm are used as a measure of GOI defect density. As can be seen from FIG. 7B, wafers having a higher GOI defect density have higher SILC values.

The procedure for determining GOI can be used to determine absolute values of GOI defect density existing on the wafer or created during wafer processing involved in manufacturing of integrated circuits. For example, a SILC Characteristic of a wafer having an unknown GOI defect density recorded via the method described above is compared with a standard library of SILC Characteristics from wafers having known levels of GOI defect density and known oxide thickness. The standard library can be generated, for example, by using the above-described method to calculate the oxide thickness and the SILC Characteristic from wafers having a standardized type and amount of GOI defect. Alternatively, the method can be used to compare the relative amounts GOI defect at the same oxide thickness either from different regions of the same wafer or from different wafers.

As described above, the light sources illuminate the wafer surface to eliminate large errors caused by changes of the semiconductor surface barrier. Additionally, systematic errors can occur when calculating the oxide field, $E_{ox}$, due to a work function offset effect, $\phi_{ms}$, between the metal reference electrode of Kelvin or Monroe probe, and the semiconductor substrate. Typically, the work function effect is a fraction of 1 volt which causes a systematic shift, $\Delta E_{ox}$=$\phi_{ms}/T_{ox}$, in the measured oxide field strength, $E_{ox}$. For example, with an often found $\phi_{ms}$ value of 0.3V, e.g., for a platinum reference electrode and 50Ωcm p-type silicon substrate, $\Delta E_{ox}$ is 0.15 MV/cm for a 200 Å thick oxide layer and 0.6 MV/cm for a 50 Å thick oxide layer. In the F-N tunneling range, shifts in oxide field strength produce relative field errors of between about 2.5% and about 10%.

The above-described method for determining oxide thickness, SILC, and GOI can be modified to incorporate a procedure to correct for the oxide field offset, $\Delta E_{ox}$ caused by the work function offset $\phi_{ms}$. Correcting the data for the oxide field offset increases the precision of the method. The $\phi_{ms}$ correcting procedure can also be executed to account for changes in $\phi_{ms}$, due to differences between individual contact potential probes and occurring when the probes are replaced or as the contact potential probe's surface ages.

$\phi_{ms}$ is determined by using the methodology described above with respect to measuring the thickness of an oxide layer. In this case, however, an oxide film with well known thickness must be used. The thickness value must be larger than 50 Å. The surface of the wafer is recharged with a low corona fluence, $F_{stress}$<10$^{-6}$ C/cm$^2$ and experimental data on ($dV_{cp}/dt$) vs. $V_{CP}$ are collected by the computer. This data is converted into J versus $E_{ox}$ where $$J=\epsilon_o\epsilon_{ox}/t_{ox}\cdot(dV_{cp}/dt) \text{ and } E_{ox}=V_{CP}/T_{ox}.$$

Since, the oxide thickness, $T_{ox}$, is already known, the data of J verses $E_{ox}$ is used to calculate $\Delta E_{ox}$. For the same oxide thickness value the ideal F-N current characteristic is calculated $J_{F-N}$ versus the oxide field $E_{ox}$. Experimental values of J is compared with calculated $J_{F-N}$. The shift between the curves along the $E_{ox}$ axis equals the oxide field offset, i.e., $\Delta E_{ox}$=$\phi_{ms}/T_{ox}$, from which $\phi_{ms}$ is determined.

Once $\phi_{ms}$ is determined such as for a specific probe or periodically, e.g., once a month or day, the $\phi_{ms}$ value can be used by the computer to correct the oxide field offset when testing oxide layers of any thickness.

Figure 8:
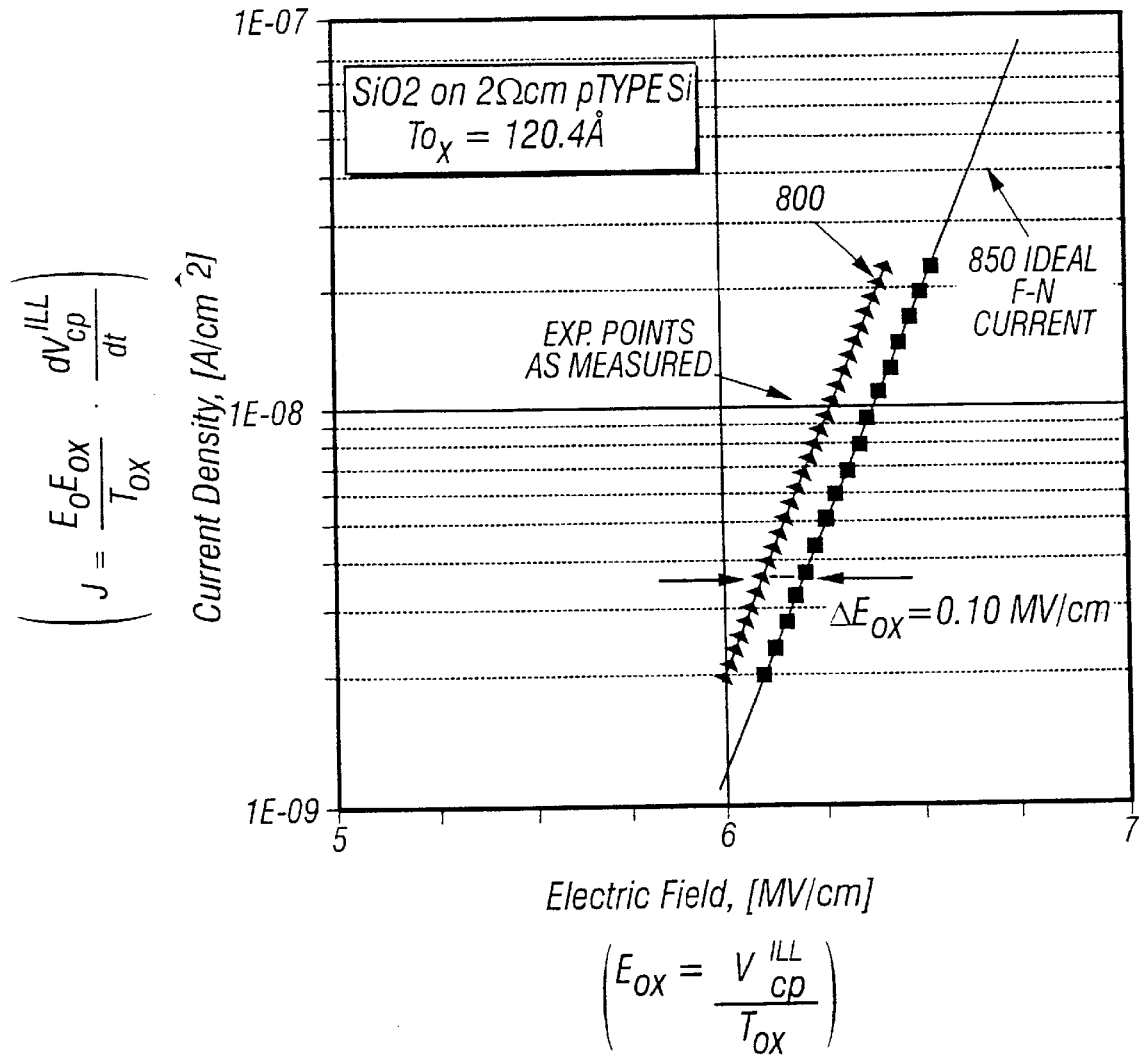
FIG. 8 is a graph of the systematic shift in the oxide field strength.

Referring to FIG. 8, J verses $E_{ox}$, data are shown for a 120 Å thick oxide on a 2Ωcm p-type silicon substrate. $\phi_{ms}$ causes a shift, i.e., by $\Delta E_{ox}$=0.10 MV/cm, of the experimental data points 800 to lower oxide field relative to an ideal F-N curve 850 of $J_{F-N}$ vs. $E_{ox}$. Ideal $J_{F-N}$ curve 850 is generated with the F-N equation and the known value of $T_{ox}$ (i.e., determined by other methods). Using the values of $\Delta E_{ox}$ and $T_{ox}$, the work function effect, i.e., $\phi_{ms}$=$\Delta E_{ox}\times T_{ox}$, is calculated to be 0.120V. A $\phi_{ms}$ value for each contact potential probe can be determined periodically by running the $\phi_{ms}$ correcting procedure and storing the $\phi_{ms}$ in the computer's memory. The computer uses the stored value for a given probe to precisely calculate $E_{ox}$=($V_{cp}^{ill}$-$\phi_{ms}$)/$T_{ox}$. The value can then be used for SILC analysis instead of the less accurate value $E_{ox}$=$V_{cp}^{ill}/T_{ox}$.

Additionally, correction to $\phi_{ms}$ values can be determined for different silicon substrate wafers to account for Fermi energy shifts in the silicon substrate due to different doping levels. These values can be incorporated into the calculations using procedures well known in the art, such as those analogous to $\phi_{ms}$ correction verse silicon doping used in the connection with measurements done on MOS capacitors.

Figure 9:
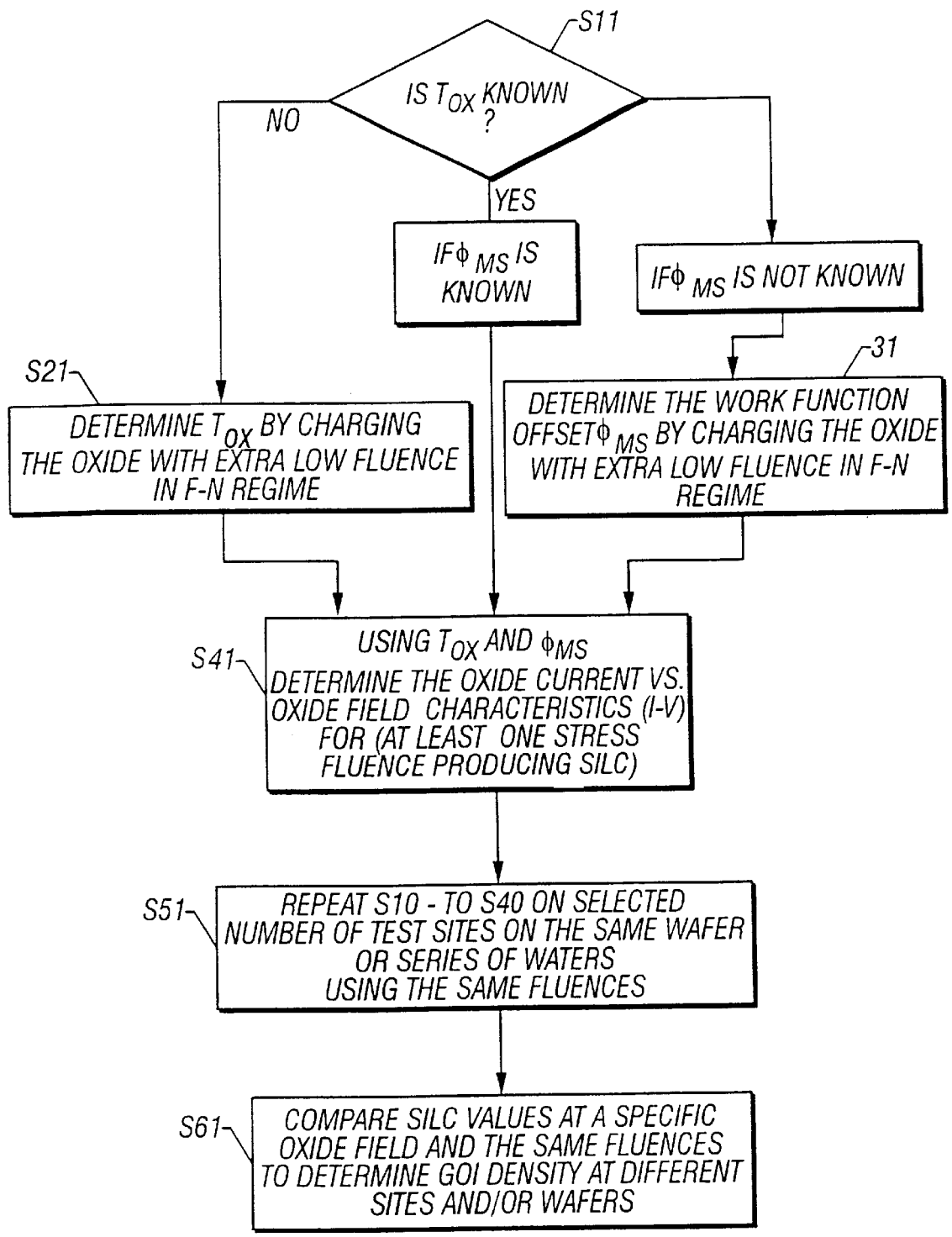
FIG. 9 is another flow diagram of a method of determining SILC and GOI.

Referring to FIG. 9, in operation, the computer uses an algorithm S01 to collect SILC and GOI data. Algorithm S01 begins by checking the computer's memory to see if the oxide thickness, $T_{ox}$, is known (S11). If $T_{ox}$ is unknown, i.e., the user does not known the thickness, the computer initiates a charging and measuring sequence (S21), charging the oxide with low fluence and determining the oxide thickness either via the Fowler-Norheim expression for oxides thicker than 50 Å or other analytical current tunneling expressions that include $T_{ox}$ as a parameter and are suitable for thinner dielectric thicknesses whereby a direct tunneling takes place. Once $T_{ox}$ is determined or input by the user, the computer checks the memory to see if $\phi_{ms}$ is known. If not, the computer initiates a charging and measuring sequence (S31), charging the oxide with low fluence and determining the work function offset. Once the work function offset and oxide thickness are known, the computer initiates a charging and measuring sequence (S41), charging the oxide with different amounts of fluence (at least one of which produces SILO) and determining the oxide current versus oxide field characteristics (I-V). The computer repeats S11-S41 on a number of test sites on the same wafer or on a series of wafers using the same amounts of fluence. The SILC values at a specific oxide field and a specific fluence are compared to determine GOI density at different sites either on the same wafer or on several wafers (S61).

In other embodiments, prior to measuring SILC and GOI, ia wafer precharging device, i.e., a corona wire electrode used in photocopiers, or a corona wire device, can precharge at least a portion, e.g., an entire, a half, or a small segment including the testing site, of the wafer surface to reduce charge leakage along the surface. Reducing surface leakage helps to minimize erroneous high SILC and GOI results. The precharge must be done using charge of the same polarity as that used in corona charge inducing dielectric stress.

For $SiO_2$ on p-type silicon, corona wafer precharging and corona stress charging on test site are done using positive charge. The wafer charging device can be integrated with or separated from the above described test system. In either case, the wafer chuck moves the wafer under the wafer precharging device and the device deposits a precharge over a portion of the wafer's surface. After precharging, the wafer chuck moves the wafer beneath the charging and measuring system for SILC and GOI analysis. Examples of wafer corona precharging devices can be found in U.S. Pat. No. 5,773,989 and in U.S. Ser. No. 08/893,404, now U.S. Pat. No. 6,037,797, entitled "Measurement of the Interface Trap Charge in an Oxide Semiconductor Layer Interface," by Lagowski et al., both of which are incorporated herein in their entirety by reference.

Figure 10A:
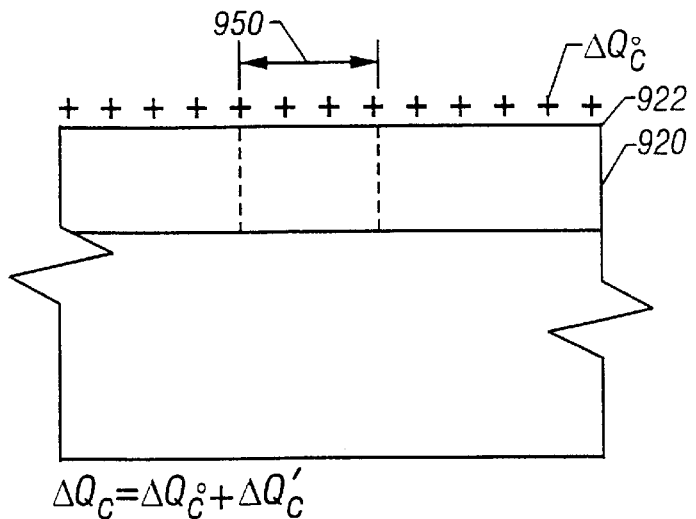
FIG. 10A is a cross-sectional side view of a portion of a semiconductor wafer having an initial low dose of charge distributed over a portion of the wafer as in the wafer precharging procedure.
Figure 10B:
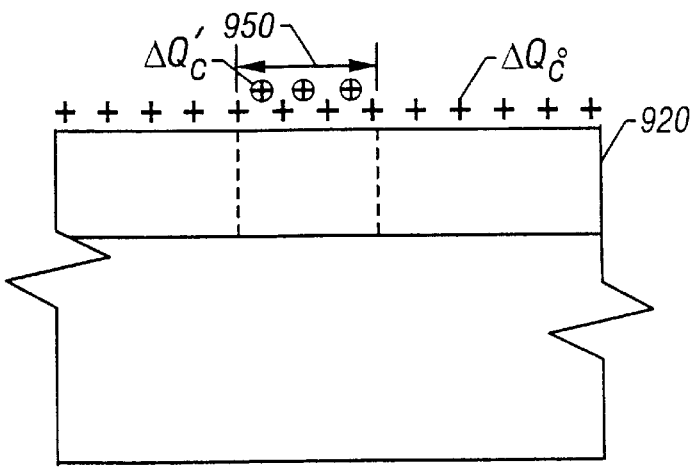
FIG. 10B is a cross-sectional side view of a portion of the wafer of FIG. 10A having additional charge over a small area of the wafer surface.

Referring to FIGS. 10A and 10B, a wafer precharging device (not shown) is used to deposit corona precharge, $\Delta Q_c^o$, onto a surface 922 of a dielectric layer 920 to precharge the wafer prior to GOI and SILC testing. During SILC and GOI testing, the charging station (See FIG. 1) deposits additional charge, $\Delta Q_c'$, onto a small area of the dielectric layer, i.e., on a test site 950, to achieve a total predetermined charge, $\Delta Q_c$, on the surface. Note that $\Delta Q_c$ is equal to the precharge, $\Delta Q_c^o$, plus the additional charge, $\Delta Q_c'$ and the computer uses the total charge, $\Delta Q_c$, deposited onto test site 950 in calculating fluence condition for comparing SILC.

Figure 10C:
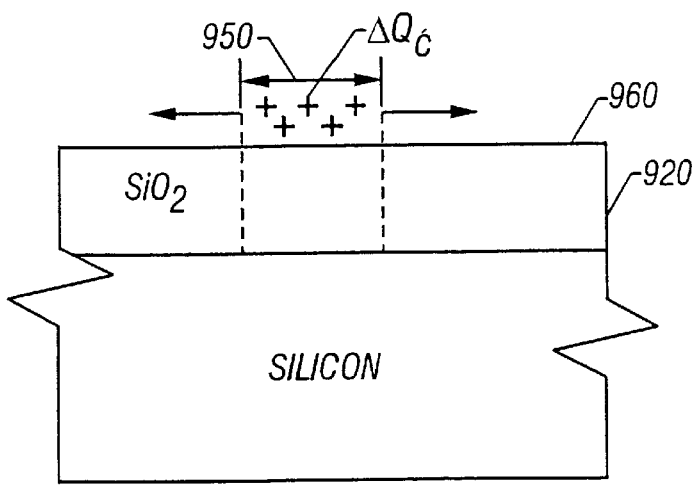
FIG. 10C is a cross-sectional side view of a portion of a semiconductor wafer having charge over a small area of the wafer surface.

Referring to FIG. 10C, charging station (See FIG. 1) deposits the total predetermined charge, $\Delta Q_c$, onto test site 950. Due to the large charge density gradient between charged test site 950 and the remaining uncharged surface 960, charge in test site 950 dissipates or leaks (arrows) onto the surrounding uncharged surface 960 causing a decrease of $\Delta Q_c$ in test site 950. Since the measuring station does not discriminate between changes in $\Delta Q_c$ by surface leakage and by charge tunneling, surface leakage can lead to erroneously high SILC and GOI.

What is claimed is:

1. A method of characterizing a dielectric layer disposed on a semiconductor wafer, the method comprising:
   positioning the semiconductor wafer relative to a test device;
   depositing on a surface of the dielectric layer a corona ionic charge at a rate and fluence sufficient to change a tunneling current between the semiconductor wafer and the dielectric layer; and
   measuring with the test device, a stress induced leakage current characteristic across the dielectric layer.

2. The method of claim 1, wherein the stress induced leakage current characteristic comprises a current density across the dielectric layer versus a dielectric field for a specific fluence of stress or the dielectric layer.

3. The method of claim 1, further comprising illuminating the dielectric layer of the semiconductor wafer while measuring the stress induced leakage current to reduce the surface barrier contribution to the stress induced leakage current.

4. The method of claim 1, wherein the corona ionic charge deposited on the dielectric surface increases a tunneling current at a given oxide electric field.

5. The method of claim 1, wherein the semiconductor wafer comprises silicon.

6. The method of claim 5, wherein the dielectric layer is $SiO_2$.

7. The method of claim 1, wherein measuring the stress induced leakage current includes using the measurement test device to apply a charge to the dielectric layer of the semiconductor wafer at a level sufficient to stress the dielectric layer by causing a current flow across the dielectric layer, and measuring a current-voltage characteristic after stressing the dielectric layer.

8. The method of claim 7, wherein applying the charge includes applying charge to the dielectric layer of the semiconductor wafer with a corona stress element.

9. The method of claim 7, wherein measuring the current-voltage characteristic includes measuring a potential difference between a probe and the dielectric layer on the semiconductor wafer and calculating a current density across the dielectric layer.

10. The method of claim 7, wherein measuring the stress induced leakage current includes precharging the dielectric layer with charge of the same polarity as the charge for stressing the dielectric layer.

11. The method of claim 7, further comprising illuminating the dielectric surface of the semiconductor wafer while applying the charge to the dielectric layer to reduce the surface barrier contribution to the stress induced leakage current.

12. The method of claim 11, further comprising illuminating the dielectric surface of the semiconductor wafer while measuring the current-voltage characteristic of the semiconductor to reduce the surface barrier contribution to the stress induced leakage current.

13. A method of measuring gate oxide integrity of a dielectric layer disposed on a semiconductor wafer, the method comprising:
   illuminating the dielectric layer with a light source to remove a voltage drop across the space charged region of the semiconductor wafer, and
   applying a charge to the dielectric layer with a deposition rate sufficient to stress the semiconductor wafer to induce a tunneling current flow.

14. The method of claim 13, wherein illuminating and measuring a current-voltage characteristic of the semiconductor wafer are simultaneous.

15. The method of claim 13, wherein applying the charge includes applying a charge to the dielectric layer of the semiconductor wafer with a corona stress element.

16. The method of claim 13, wherein measuring the current-voltage characteristic includes measuring a current density across the dielectric layer and a potential difference between a probe and the semiconductor wafer.

17. The method of claim 13, wherein measuring the current-voltage characteristic includes precharging the dielectric layer of the semiconductor wafer.

18. The method of claim 13, further comprising correcting the measured current-voltage characteristic for a work function effect.

19. The method of claim 13, further comprising measuring a voltage versus time characteristic of the semiconductor wafer after applying the charge to the dielectric layer, and determining a current-voltage characteristic.

20. The method of claim 13, wherein illuminating and applying the charge to the dielectric layer are simultaneous.

21. The method of claim 20, further comprising simultaneously illuminating and measuring a current-voltage characteristic of the semiconductor wafer.

22. The method of claim 13, wherein the semiconductor wafer comprises silicon.

23. The method of claim 22, wherein the dielectric layer is $SiO_2$.

24. A method of measuring gate oxide integrity of a dielectric layer disposed on a semiconductor wafer, the method comprising:
   moving the wafer into position below a charge source,
   illuminating an area of the wafer under the source with a first light source,
   setting charging conditions of the charge source,
   turning on the charge source to stress the area of the wafer,
   turning off the charge source and the first light source,
   moving a probe above the wafer over the area stressed by the charge source, illuminating the area of the wafer under the probe with a second light source, measuring the contact potential as a function of time after turning off the charge source, and calculating oxide current density as a function of oxide field.

25. The method of claim 24, further comprising determining a magnitude of a stress induced leakage current at a constant oxide field.

26. A method of measuring the gate oxide integrity of a dielectric layer disposed on a semiconductor wafer, the method comprising:

measuring a stress induced leakage current across the dielectric layer on the wafer, determining a magnitude of the stress induced leakage current as a function of an oxide electric field strength, and comparing the magnitude of stress induced leakage current to a standard magnitude of stress current at an oxide electric field strength, wherein the stress results from a corona ionic charge being deposited on a surface of the dielectric layer at a rate and a fluence sufficiently high to change a tunneling current between the semiconductor wafer and the dielectric layer.

27. The method of claim 26, further comprising determining the thickness of the oxide layer.

28. The method of claim 26, wherein the magnitude of the stress induced leakage current is determined at a constant stress fluence.

29. The method of claim 26, wherein the corona ionic charge deposited on the dielectric surface increases the tunneling current at a given oxide electric field.

30. A method of measuring a thickness of a dielectric layer disposed on a semiconductor wafer, the method comprising:

applying a charge to the dielectric layer at a level sufficient to stress the semiconductor wafer to produce a tunneling current between the semiconductor wafer and the dielectric layer, the tunneling current being related to the thickness of the dielectric layer, measuring a current-voltage characteristic of the semiconductor wafer after applying the charge to the dielectric layer, calculating an oxide current density as a function of oxide field, and determining the dielectric thickness from the calculated oxide current density and oxide field.

* * * * *